(12) United States Patent
Park et al.

(10) Patent No.: US 12,666,579 B2
(45) Date of Patent: Jun. 23, 2026

(54) ELECTRONIC DEVICE COOLING HEAT FROM ELECTRONIC ELEMENTS

(71) Applicant: HYUNDAI MOBIS CO., LTD., Seoul (KR)

(72) Inventors: Sung Hyun Park, Yongin-si (KR); Hyun Seong Lee, Yongin-si (KR); Sang Eon Im, Yongin-si (KR); Sun Jong Oh, Yongin-si (KR); Byung Soo Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 221 days.

(21) Appl. No.: 18/414,231

(22) Filed: Jan. 16, 2024

(65) Prior Publication Data

US 2025/0133705 A1     Apr. 24, 2025

(30) Foreign Application Priority Data

Oct. 24, 2023     (KR) ........................ 10-2023-0143081

(51) Int. Cl.
*H05K 7/20* (2006.01)
(52) U.S. Cl.
CPC ..... *H05K 7/20863* (2013.01); *H05K 7/20145* (2013.01); *H05K 7/20418* (2013.01); *H05K 7/20881* (2013.01)

(58) Field of Classification Search
CPC .......... H05K 7/20436; H05K 7/20145; H05K 7/20863; H05K 7/20881; H05K 7/20418
See application file for complete search history.

(56) References Cited

U.S. PATENT DOCUMENTS

| | | | |
|---|---|---|---|
| 2010/0027220 A1* | 2/2010 | Hughes | H05K 7/20445 361/702 |
| 2012/0043652 A1* | 2/2012 | Ushijima | H05K 7/20936 257/E23.08 |
| 2024/0155816 A1* | 5/2024 | Matsuoka | H01L 23/467 |

FOREIGN PATENT DOCUMENTS

| | | | |
|---|---|---|---|
| JP | H0356080 Y2 * | 12/1991 | |
| JP | 2022015561 A * | 1/2022 | |
| KR | 10-2563739 B1 | 8/2023 | |

* cited by examiner

*Primary Examiner* — Zachary Pape
(74) *Attorney, Agent, or Firm* — Morgan, Lewis & Bockius LLP

(57) ABSTRACT

The electronic device includes a housing, a substrate disposed in an interior of the housing, an electronic element mounted on the substrate, a first cooling member in contact with the electronic element and configured to absorb heat generated by the electronic element, and a second cooling member spaced apart from the electronic element and configured to circulate air into and out of the housing.

16 Claims, 10 Drawing Sheets

ELECTRONIC DEVICE COOLING HEAT FROM ELECTRONIC ELEMENTS

CROSS-REFERENCE TO RELATED APPLICATION

This application claims priority from and the benefit of Korean Patent Application No. 10-2023-0143081, filed on Oct. 24, 2023, which is hereby incorporated by reference for all purposes as if set forth herein.

BACKGROUND

Technical Field

Exemplary embodiments of the present disclosure relate to an electronic device, and more particularly, to an electronic device installed in a vehicle.

Discussion of the Background

Vehicles are equipped with various types of electronic control units to control electronic operations of the vehicles. Recently, these electronic control units have been applied with chipsets with larger power consumption to support various functions and apply high-performance features, and the importance of a heat dissipation system to efficiently dissipate the heat generated by the chipset has been emphasized.

In conventional electronic control units, fans are installed outside or inside the electronic control units to secure heat dissipation performance. However, if the fan is installed outside the electronic control unit, a product has an increased size, making it difficult to be applied in a vehicle with a limited space. Also, if the fan is installed inside the electronic control unit, the convection resistance inside the product reduces the heat dissipation effect by convection.

The background technology of the present disclosure is disclosed in Korean Patent Registration No. 10-2563739 (registered on Aug. 11, 2013 and entitled 'Device for Cooling Vehicle Electronics').

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Various embodiments are directed to an electronic device capable of efficiently cooling heat from electronic elements.

In an embodiment, an electronic device includes: a housing; a substrate disposed in an interior of the housing; an electronic element mounted on the substrate; a first cooling member in contact with the electronic element and configured to absorb heat generated by the electronic element; and a second cooling member spaced apart from the electronic element and configured to circulate air into and out of the housing.

The first cooling member may include: a heat pipe including a first end in contact with the electronic element and a second end spaced apart from the first end, and configured to transfer heat received from the electronic element from the first end toward the second end; and a heat dissipation member in contact with the heat pipe and configured to dissipate heat received from the heat pipe to the outside of the housing.

The heat dissipation member may include: a heat dissipation body coupled to the housing and in contact with the heat pipe; a first heat dissipation portion protruding from the heat dissipation body toward the outside of the housing; and a second heat dissipation portion protruding from the heat dissipation body toward the outside of the housing and spaced apart from the first heat dissipation portion.

A volume of the second heat dissipation portion may be greater than a volume of the first heat dissipation portion.

The first heat dissipation portion may be disposed between the first end and the second end.

The second cooling member may include: a fan coupled to the housing and configured to draw air from the outside to the inside of the housing; a first guide portion guiding, toward the heat pipe, a flow of air drawn to the inside of the housing by the fan; and a second guide portion guiding, toward the heat dissipation member, a flow of air drawn to the inside of the housing by the fan.

The first guide portion may include: an inner channel disposed between the substrate and the second end; and a discharge hole penetrating through the housing or the heat dissipation body and configured to discharge air drawn into the inner channel to the outside of the housing.

A gap between the substrate and the second end may be greater than a gap between the substrate and the first end.

The second guide portion may include: an outer channel externally disposed on the housing in a position facing the first heat dissipation portion; and a transfer hole penetrating through the heat dissipation body so as to be connected to the outer channel and configured to transfer air drawn to the inside of the housing to the outer channel.

The first heat dissipation portion may be provided in plural so that the outer channel may be disposed between adjacent ones of the plurality of first heat dissipation portions.

The electronic device may further include: a first blocking member disposed between the first heat dissipation portion and the second heat dissipation portion and configured to block moisture from entering the outer channel; and a second blocking member protruding from the outer channel toward the transfer hole and configured to block moisture from entering the inside of the housing.

The first blocking member may be recessed inward from a top surface of the heat dissipation member.

The first blocking member may be disposed parallel to the outer channel.

The second blocking member may be disposed at an end of the outer channel.

A height of the second blocking member is less than a height of the transfer hole.

In the electronic device according to the present disclosure, the electronic element may be cooled through conduction and forced convection by the first and second cooling members, respectively, thereby improving heat dissipation performance, and providing a reliable heat dissipation operation even under various usage conditions, such as when the fan fails to operate.

In the electronic device according to the present disclosure, the forced convection paths may be implemented inside and outside the housing with a single fan by the first and second guide portions, thereby obtaining efficient heat dissipation performance without expanding a package space.

In the electronic device according to the present disclosure, the heat generated by the electronic element may be distributed over a large area by the heat pipe, thereby further improving the heat dissipation efficiency of the heat dissipation member.

In the electronic device according to the present disclosure, as the volume of the second heat dissipation portion is formed larger than the volume of the first heat dissipation portion, the thermal density of the heat generated by the electronic element may be reduced, thereby further improving the heat dissipation performance.

In the electronic device according to the present disclosure, damage or malfunction of the electronic element due to an inflow of moisture to the inside of the housing may be prevented by the first and second blocking members.

BRIEF DESCRIPTION OF THE DRAWINGS

FIG. 5 is a cross-sectional view cut along line B-B' of FIG. 1.

FIGS. 9 and 10 are diagrams schematically illustrating operational states of the electronic device according to embodiments of the present disclosure.

DETAILED DESCRIPTION OF THE ILLUSTRATED EMBODIMENTS

Figure 1:
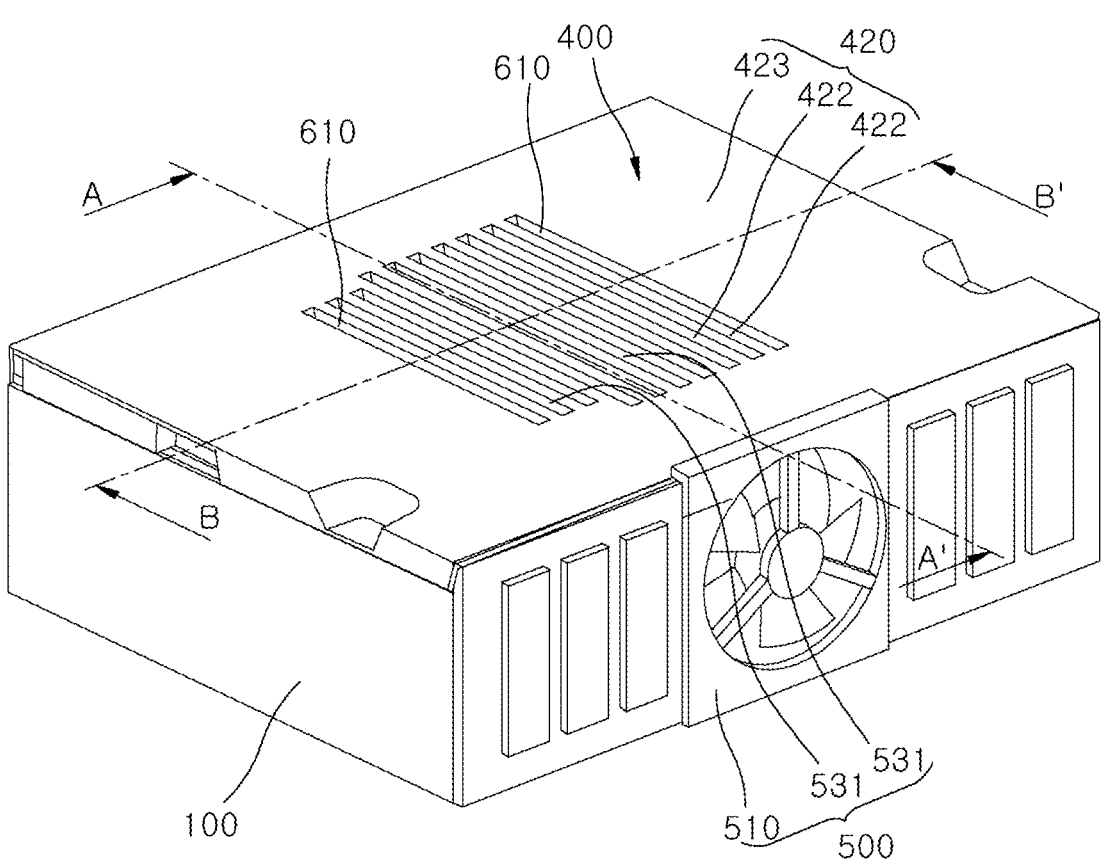
FIG. 1 is a perspective view schematically illustrating the configuration of an electronic device according to an embodiment of the present disclosure.
Figure 1:
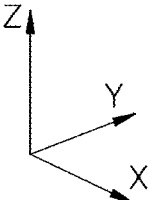

Hereinafter, embodiments of an electronic device according to the present disclosure will be described with reference to the accompanying drawings.

In the description, the thicknesses of the lines or the sizes of the components illustrated in the drawings may be exaggerated for clarity and convenience of explanation. In addition, the terms to be described later are terms defined in consideration of functions in the present disclosure, which may vary depending on the intention of a user or an operator, or a usual practice in the art. Therefore, definitions of these terms should be made based on the entire contents of this specification.

In addition, in this specification, when referring to a part "being connected (or coupled)" to another part, embodiments include not only "being directly connected (or coupled)" to another part, but also "being indirectly connected (or coupled)" to another part with other intermediate member therebetween. In this specification, when referring to a part "including (or comprising)" a component, it is meant that the part is capable of "including (or comprising)"

additional components, not to exclude other components, unless specifically stated to the contrary.

Also, throughout this specification, the same reference numerals may refer to the same component. Even if the same or similar reference numerals are not mentioned or illustrated in a particular drawing, they may be illustrated based on other drawings. Furthermore, even if particular drawings are not labeled with reference numerals, the reference numerals may be described in light of the other drawings. Furthermore, the number, shape, size, and relative differences in size of the components illustrated in the drawings of this application are set for ease of understanding and are not intended to limit embodiments, so they may be implemented in various forms.

Figure 2:
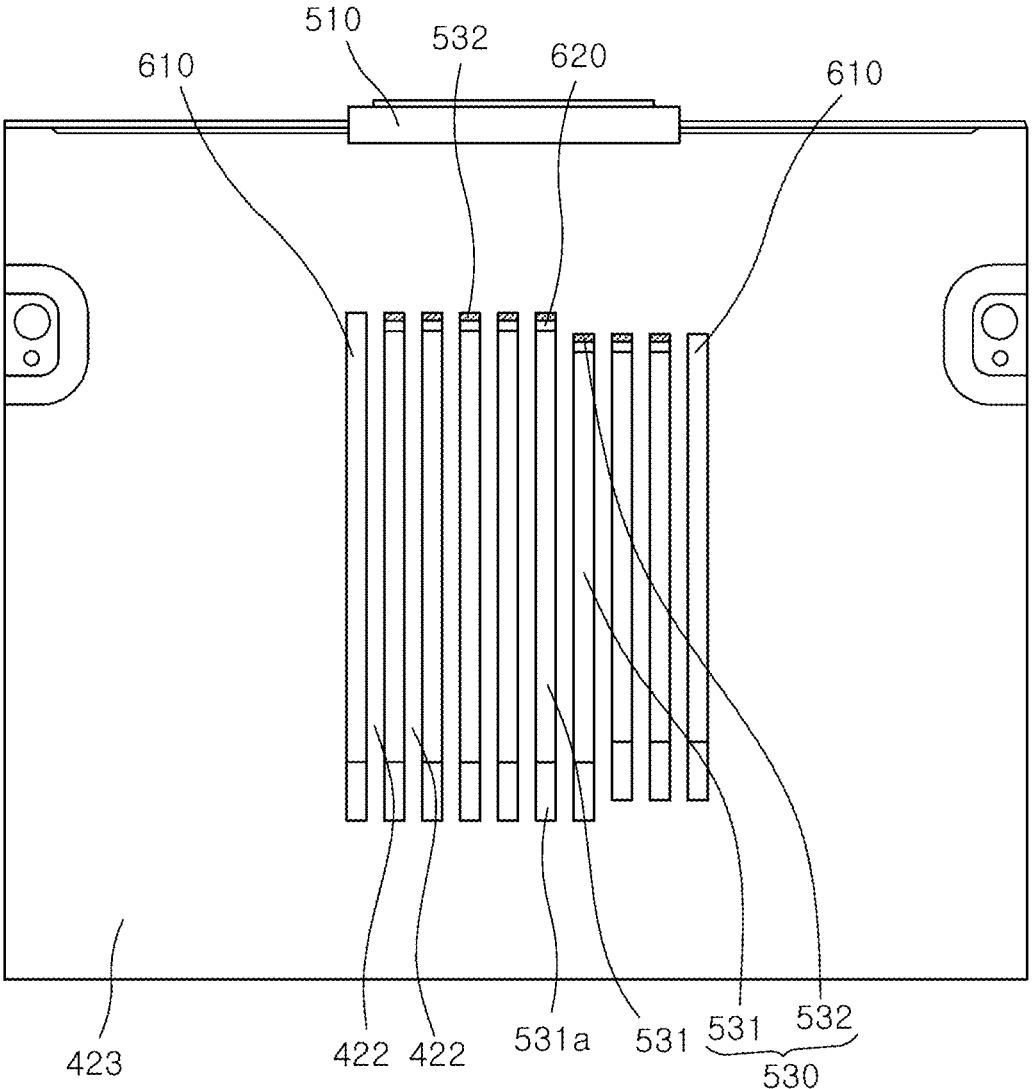
FIG. 2 is a plan view schematically illustrating the configuration of the electronic device according to the embodiment of the present disclosure.
Figure 2:
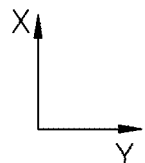
Figure 3:
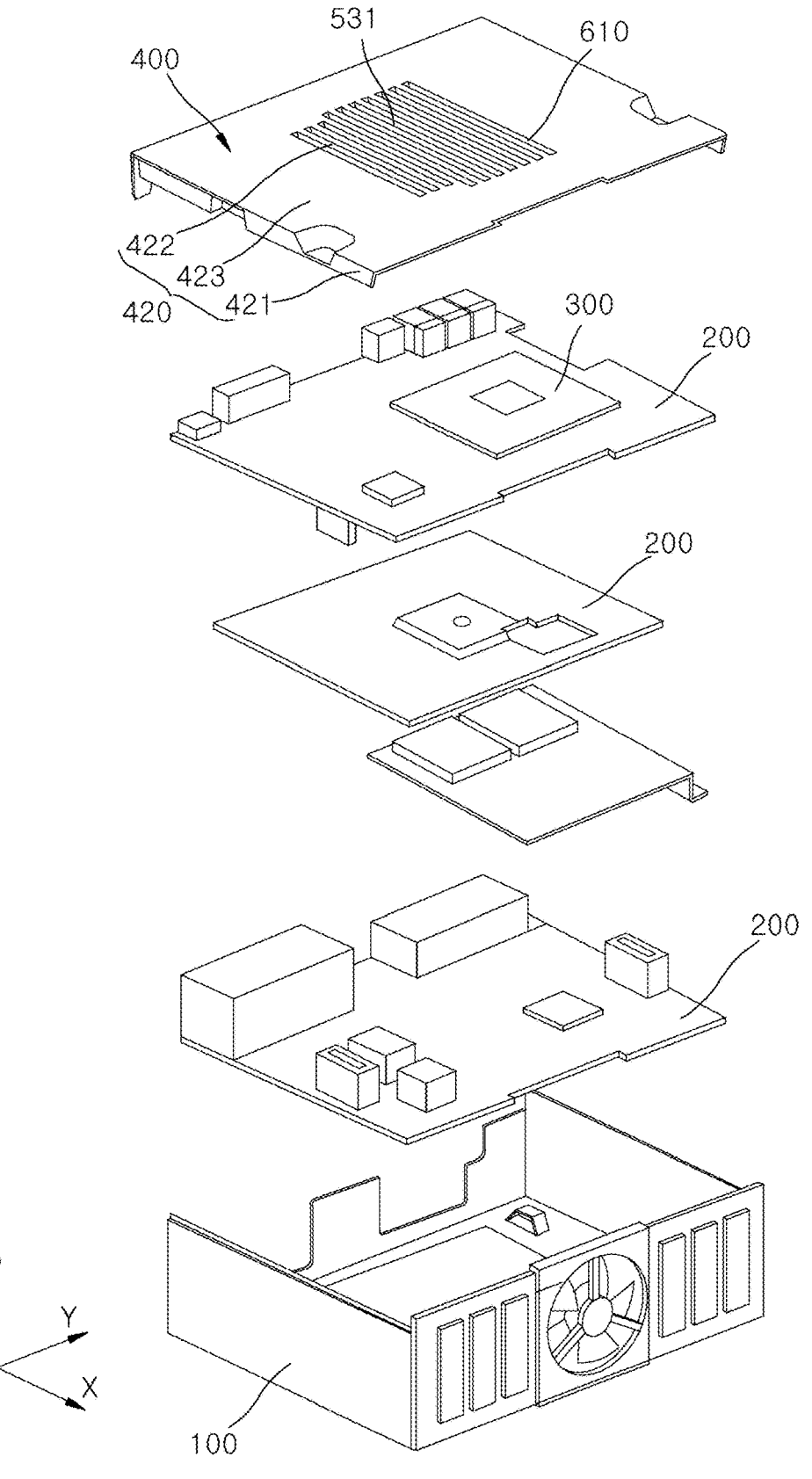
FIG. 3 is an exploded perspective view schematically illustrating the configuration of the electronic device according to the embodiment of the present disclosure.
Figure 4:
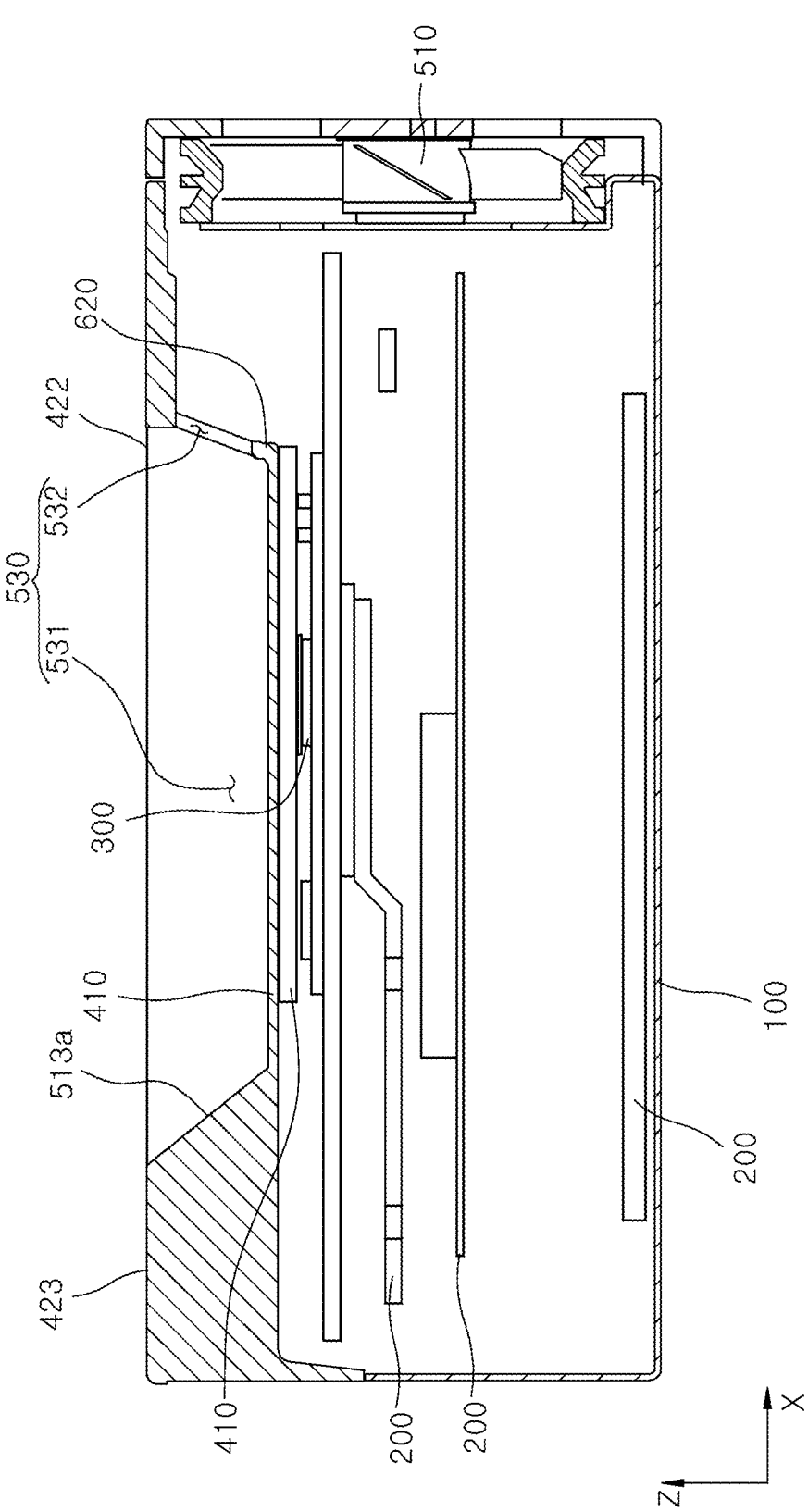
FIG. 4 is a cross-sectional view cut along line A-A' of FIG. 1.
Figure 5:
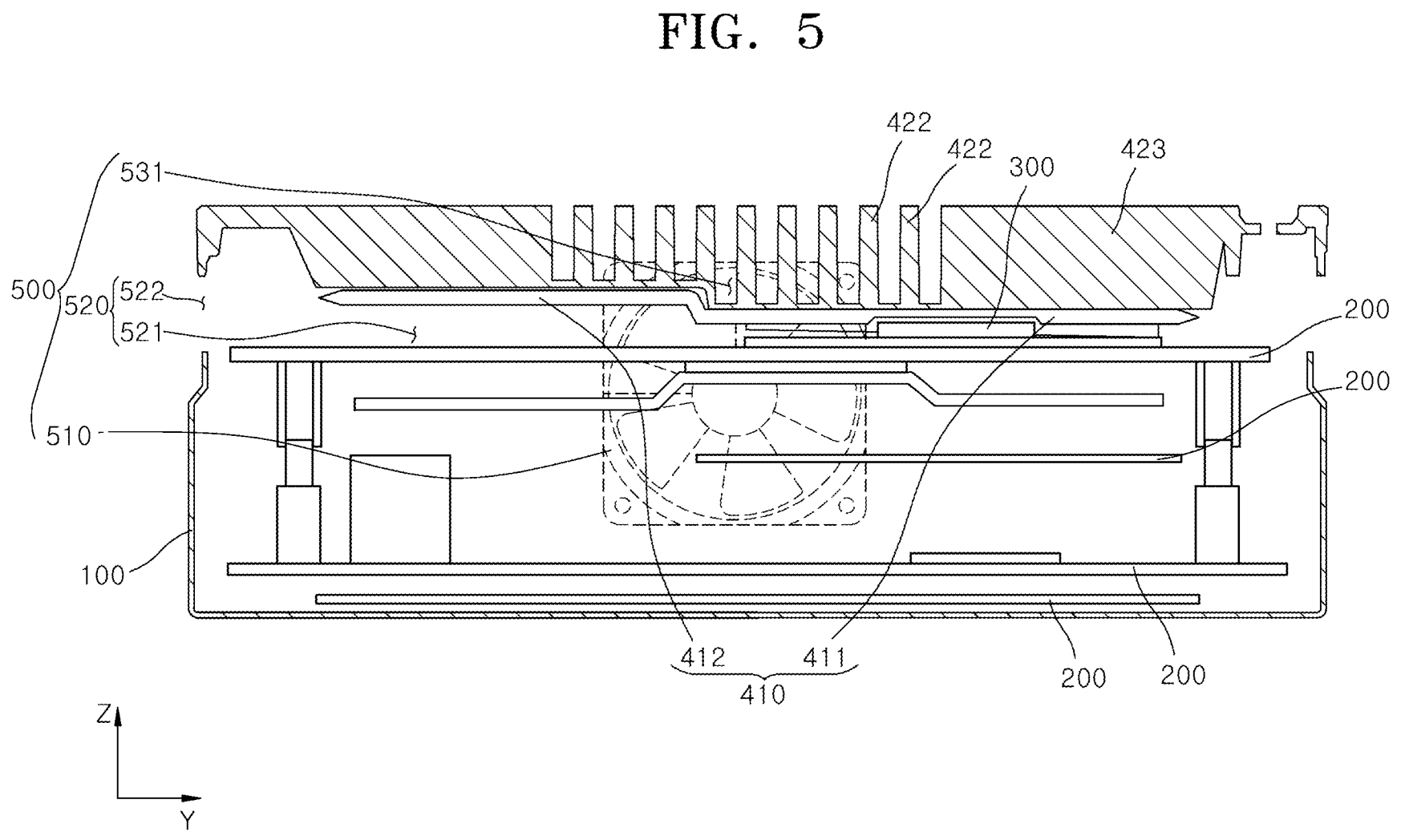

FIG. 1 is a perspective view schematically illustrating the configuration of an electronic device according to an embodiment of the present disclosure, FIG. 2 is a plan view schematically illustrating the configuration of the electronic device according to the embodiment of the present disclosure, FIG. 3 is an exploded perspective view schematically illustrating the configuration of the electronic device according to the embodiment of the present disclosure, FIG. 4 is a cross-sectional view cut along line A-A' of FIG. 1, and FIG. 5 is a cross-sectional view cut along line B-B' of FIG. 1.

Referring to FIGS. 1 to 5, the electronic device according to the embodiment includes a housing 100, a substrate 200, an electronic element 300, a first cooling member 400, and a second cooling member 500.

The housing 100 forms the schematic appearance of the electronic device and may accommodate the substrate 200 and the electronic element 300, which are described later. The housing 100 may be formed to have a hollow box shape with an upper portion opened. The housing 100 may be formed of a metal material, such as aluminum, steel, or the like, that has sufficient rigidity and high thermal conductivity. The housing 100 may be mounted in various vehicle interior spaces such as a cockpit or the like of a vehicle. The housing 100 may be secured inside the vehicle interior spaces by various fastening means, such as brackets (not shown).

The substrate 200 may be disposed inside the housing 100. The substrate 200 may be a printed circuit board (PCB) having a roughly flat plate shape. The substrate 200 may be disposed with a top surface and a bottom surface facing an open side and a bottom surface of the housing 100, respectively. The substrate 200 may be secured to the inside of the housing 100 by various types of fastening means, such as brackets, bolts, or the like.

The substrate 200 may be provided in plural. The plurality of substrates 200 may be stacked along a vertical direction in the interior of the housing 100. The number of substrates 200 is not limited to three as illustrated in FIGS. 3 through 5, but may be varied to allow for design changes.

The electronic element 300 may be mounted on the substrate 200. The electronic element 300 may include at least one of an active element, a passive element, an IC chip, a CPU, a GPU, a power supply, or any other element or component that is be mounted on the substrate 200 to perform various electronic functions of an electronic device. In the process of performing electronic functions of the electronic device, the electronic element 300 may generate heat due to its own resistance or the like.

As described herein, the electronic element 300 may refer to an element or component mounted on a topmost substrate 200 among various elements or components mounted on respective substrates 200.

The first cooling member 400 may be in contact with the electronic element 300 so as to absorb heat generated by the electronic element 300. In other words, the first cooling member 400 may function as a heat sink for cooling the electronic element 300 through conduction action due to contact with the electronic element 300.

The first cooling member 400 may include a heat pipe 410 and a heat dissipation member 420.

Figure 6:
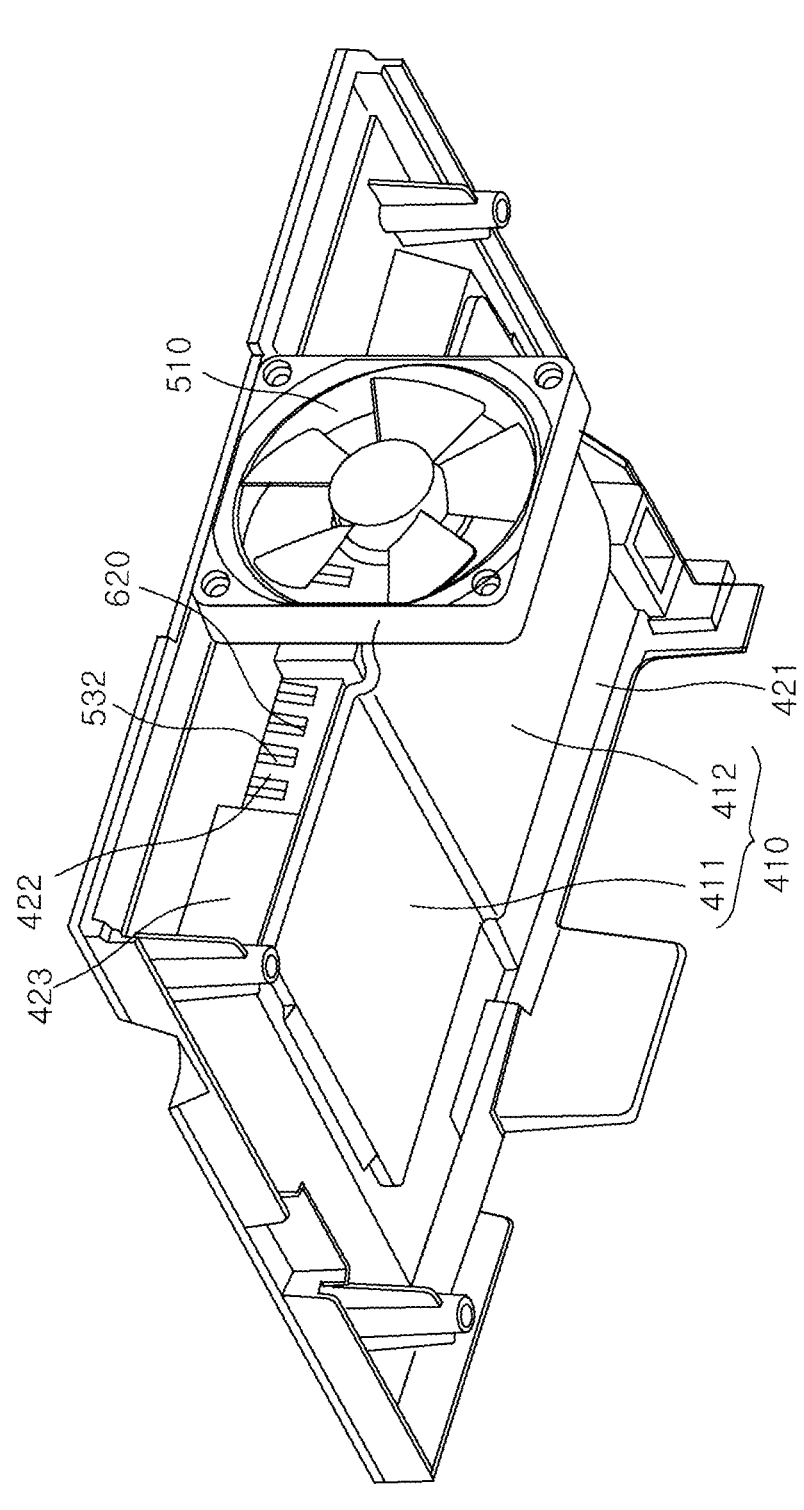
FIG. 6 is a bottom perspective view schematically illustrating the configuration of a first cooling member according to an embodiment of the present disclosure.

FIG. 6 is a bottom perspective view schematically illustrating the configuration of a first cooling member according to an embodiment of the present disclosure.

Referring to FIGS. 1 to 6, the heat pipe 410 may be exemplified as various types of heat transfer means capable of absorbing heat from an external heat source so that the working fluid evaporates to a gaseous state and flows from an evaporator toward a condenser due to an expansion force of the working fluid so that the heat generated by the external heat source may be transferred in one direction.

The heat pipe 410 may be formed to have a roughly plate-like shape. The heat pipe 410 may be disposed to face the topmost substrate 200 vertically on the upper side of the housing 100.

The heat pipe 410 may include a first end 411 and a second end 412 spaced apart from each other. The first end 411 of the heat pipe 410 may be in contact with the electronic element 300 mounted on the substrate 200. Accordingly, heat generated by the electronic element 300 may be transferred to the heat pipe 410 through conduction. The heat pipe 410 may transfer the heat received from the electronic element 300 in a direction from the first end 411 toward the second end 412. The first end 411 and the second end 412 may be disposed to face different inner wall surfaces of the housing 100. In an example, the first end 411 and the second end 412 may be spaced apart along a direction parallel to an Y-axis with respect to FIGS. 1 to 5. Accordingly, the heat pipe 410 may cause the heat transferred from the electronic element 300 to be uniformly distributed throughout the area of the heat dissipation member 420 to be described below.

The heat dissipation member 420 may be in contact with the heat pipe 410 and may receive heat from the heat pipe 410 through conduction. The heat dissipation member 420 may dissipate the heat transferred from the heat pipe 410 to the outside of the housing 100. More specifically, the heat dissipation member 420 may dissipate heat transferred from the heat pipe 410 to the outside of the housing 100 through convection by external air of the housing 100 and its own radiation. The heat dissipation member 420 may be formed of a material, such as aluminum, which has a high heat capacity and thermal conductivity.

The heat dissipation member 420 may include a heat dissipation body 421, a first heat dissipation portion 422, and a second heat dissipation portion 423.

The heat dissipation body 421 may be coupled to the housing 100 and may support the first heat dissipation portion 422 and second heat dissipation portion 423 as a whole. The heat dissipation body 421 may be disposed on a top side of the housing 100 and may be in contact with a top surface of the heat pipe 410. An edge side of the heat dissipation body 421 may be coupled to the top portion of the housing 100. In this case, the heat dissipation body 421 may be coupled to the top portion of the housing 100 by a variety of fastening means, such as bolting, welding, fitting, etc. The specific shape of the heat dissipation body 421 is not limited to the shape illustrated in FIG. 6, but various design variations are possible within the technical scope of a shape capable of being fastened to the top portion of the housing 100 so as to be in contact with the heat pipe 410.

The first heat dissipation portion 422 protrudes from the heat dissipation body 421 toward the outside of the housing 100 and may be in contact with external air of the housing 100. The first heat dissipation portion 422 may dissipate heat transferred from the electronic element 300 to the outside of the housing 100 through convection and radiation by the external air of the housing 100. The first heat dissipation portion 422 may be formed to have the form of fins on a flat plate that protrude vertically upwardly from the top surface of the heat dissipation body 421. The first heat dissipation portion 422 may be disposed in a central portion of the heat dissipation body 421, more specifically in a position facing the area between the first end 411 and the second end 412 of the heat pipe 410. The first heat dissipation portion 422 may be provided in plural. The plurality of first heat dissipation portions 422 may be arranged along a direction from the first end 411 toward the second end 412, i.e., a direction parallel to the Y-axis direction with respect to FIGS. 1 to 6. Neighboring first heat dissipation portions 422 may be disposed parallel to each other and spaced apart by a predetermined distance.

The second heat dissipation portion 423 may protrude from the heat dissipation body 421 toward the outside of the housing 100 and may be in contact with external air of the housing 100. The second heat dissipation portion 423, together with the first heat dissipation portion 422, may dissipate heat transferred from the electronic element 300 to the outside of the housing 100 through convection and radiation by the external air of the housing 100. The second heat dissipation portion 423 may be spaced apart from the first heat dissipation portion 422. In an example, the second heat dissipation portion 423 may be disposed to entirely surround the first heat dissipation portion 422 on a top side of the heat dissipation body 421.

The volume of the second heat dissipation portion 423 may be greater than the volume of the first heat dissipation portion 422. More specifically, the volume of the second heat dissipation portion 423 may be greater than the volume of each of the first heat dissipation portions 422 and the sum of the volumes of the plurality of first heat dissipation portions 422. Accordingly, the second heat dissipation portion 423 may increase the overall heat capacity of the heat dissipation member 420 to induce the heat transferred from the electronic element 300 to the heat pipe 410 to be transferred to the heat dissipation member 420 more quickly, and may reduce the thermal density of the heat generated by the electronic element 300 to further improve the heat dissipation performance.

The second cooling member 500 may be spaced apart from the electronic element 300 and may be configured to circulate air into and out of the housing 100. In other words, the second cooling member 500 may function as a heat sink to cool the electronic element 300 through convection action caused by a flow of air.

The second cooling member 500 may include a fan 510, a first guide portion 520, and a second guide portion 530.

The fan 510 may be coupled to the housing 100 and may draw air from the outside to the inside of the housing 100. The fan 510 may be exemplified as various type of motorized device that can be powered from an external source to change a flow direction of external air of the housing 100 toward an interior of the housing 100.

The fan 510 may be coupled to a lateral side of the housing 100. The fan 510 may be disposed, intersecting with respect to the substrate 200 and the heat pipe 410. The fan 510 may draw external air of the housing 100 into the interior of the housing 100 along a direction intersecting a direction from the first end 411 toward the second end 412. In an example, the fan 510 may draw external air of the housing 100 into the interior of the housing 100 along a direction parallel to an X-axis with respect to FIGS. 1 to 6. The height of the fan 510 may be formed to be greater than the stacking height of the plurality of substrates 200, that is, a distance between the topmost substrate 200 and the bottommost substrate 200.

The first guide portion 520 may guide a flow of air drawn into the interior of the housing 100 by the fan 510 toward the heat pipe 410. In other words, the first guide portion 520 may function as a heat exchanger to induce heat exchange between the air and the heat pipe 410 by bringing the air drawn into the interior of the housing 100 into contact with the heat pipe 410.

The first guide portion 520 may include an inner channel 521 and a discharge hole 522.

The inner channel 521 may refer to a space disposed between the substrate 200 and the second end 412 in the overall interior space of the housing 100. One side of the inner channel 521 may be disposed facing the fan 510. Accordingly, air drawn into the interior of the housing 100 by the fan 510 may enter the space between the substrate 200 and the second end 412 through one side of the inner channel 521 and contact the second end 412 to cool the second end 412 through convection.

A gap between the substrate 200 and the second end 412, that is, the height of the inner channel 521, may be greater than a gap between the substrate 200 and the first end 411. More specifically, the second end 412 may be disposed at a higher position than the first end 411. Between the first end 411 and the second end 412, a stepped portion 413 may be formed with both ends disposed crosswise with respect to the first end 411 and the second end 412. Accordingly, the heat pipe 410 may expand the volume of the inner channel 521 to cause more air to be drawn into the inner channel 521, thereby improving the cooling efficiency of the second end 412.

The discharge hole 522 may penetrate through the housing 100 or the heat dissipation body 421 and allow air drawn into the inner channel 521 to be discharged to the outside of the housing 100. In the present embodiment, the discharge hole 522 may have the form of a hole formed through a side of the heat dissipation body 421. However, the location of the discharge hole 522 is not limited to this embodiment, and may also be formed through a side of the housing 100. The discharge hole 522 may communicate on both sides with the inner channel 521 and the outer space of the housing 100, respectively. Accordingly, the discharge hole 522 may discharge air heated by heat exchange with the second end 412 from the inner channel 521 to improve the cooling efficiency of the second end 412.

The second guide portion 530 may guide a flow of air drawn into the interior of the housing 100 by the fan 510 toward the heat dissipation member 420. In other words, the second guide portion 530 may function as a heat exchanger to induce heat exchange between the air and the heat dissipation member 420 by bringing the air drawn into the interior of the housing 100 into contact with the heat dissipation member 420.

The second guide portion 530 may include an outer channel 531 and a transfer hole 532.

The outer channel 531 may be disposed on an outer side of the housing 100 so as to face the first heat dissipation portion 422. The outer channel 531 may have the form of a groove that is recessed downwardly from a top surface of the heat dissipation member 420. In an example, the outer channel 531 may refer to a hollow space formed between neighboring first heat dissipation portions 422 as the neighboring first heat dissipation portions 422 are spaced apart from each other. If there are three or more first heat dissipation portions 422, a plurality of outer channels 531 may be provided. In this case, respective outer channel 531 may be disposed between different pairs of first heat dissipation portions 422. The outer channel 531 may be disposed in a longitudinal direction parallel to a longitudinal direction of the first heat dissipation portion 422. A first end of the outer channel 531 may have an inclined surface 531a obliquely extending from an interior of the heat dissipation member 420 toward a top surface of the heat dissipation member 420.

The transfer hole 532 may be formed through the heat dissipation body 421 to transfer air drawn into the interior of the housing 100 by the fan 510 to the outer channel 531. In the present embodiment, the transfer hole 532 may be formed to have the form of a hole extending from the other end of the outer channel 521 located on the opposite side of the inclined surface 531a towards the interior space of the housing 100. There may be a plurality of transfer holes 532. Respective transfer hole 532 may be formed separately for each outer channel 531.

The electronic device according to this embodiment may further include a first blocking member 610 and a second blocking member 620 for blocking moisture from entering the inside of the housing 100.

Figure 7:
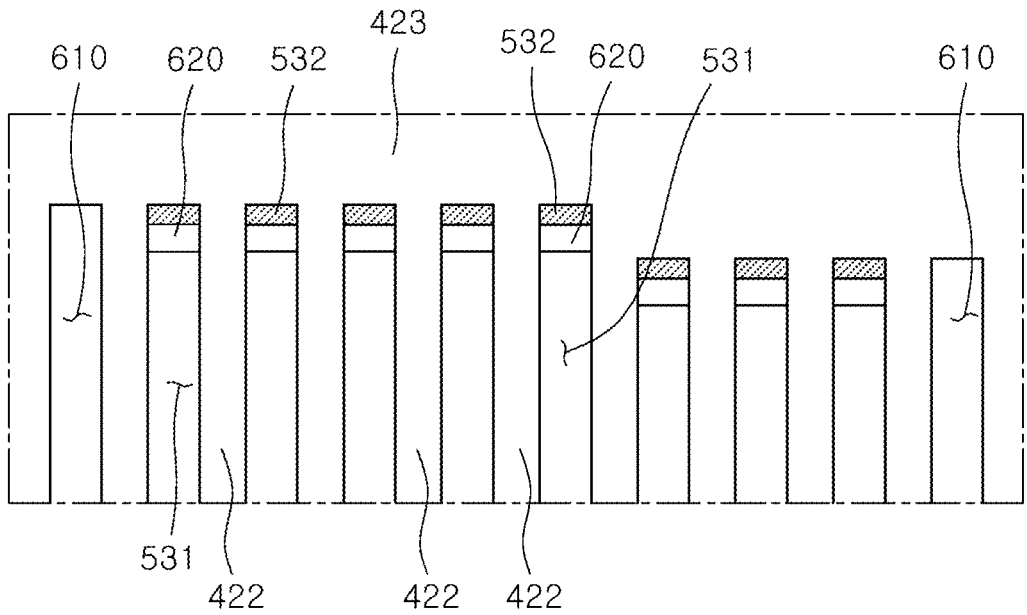
FIG. 7 is a plan view schematically illustrating the configuration of a first blocking member and a second blocking member according to an embodiment of the present disclosure.
Figure 8:
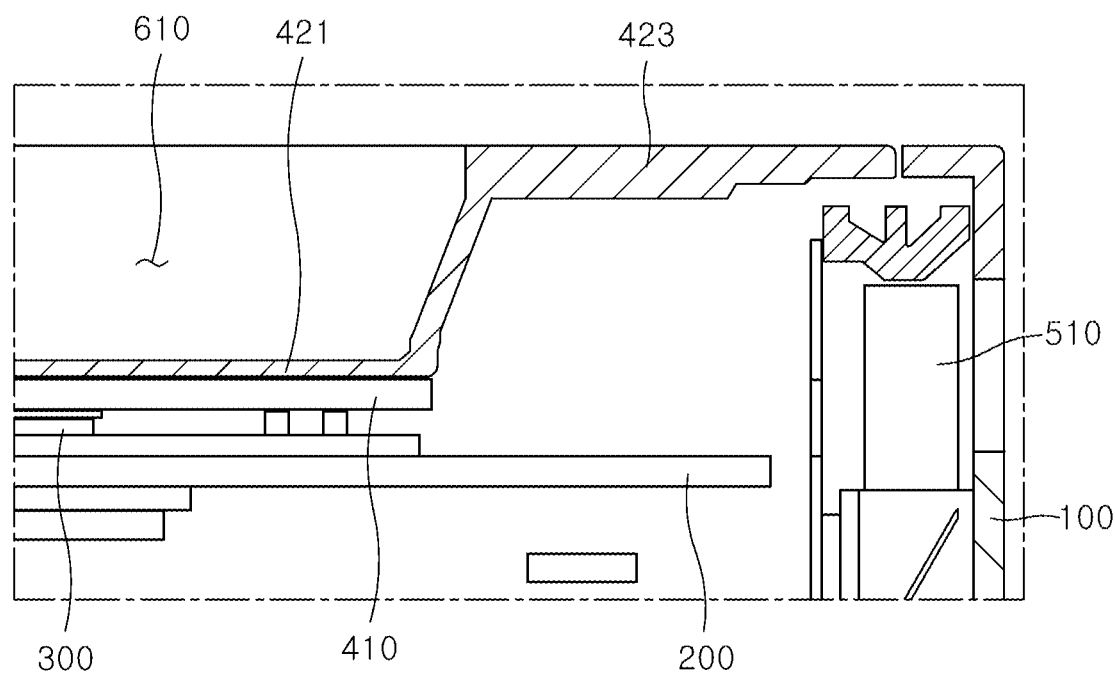
FIG. 8 is a cross-sectional view schematically illustrating the configuration of the first blocking member according to an embodiment of the present disclosure.

FIG. 7 is a plan view schematically illustrating the configuration of a first blocking member and a second blocking member according to an embodiment of the present disclosure, and FIG. 8 is a cross-sectional view schematically illustrating the configuration of the first blocking member according to an embodiment of the present disclosure.

Referring to FIGS. 7 and 8, the first blocking member 610 may block moisture from entering the outer channel 531 from the outside of the housing 100 and the heat dissipation member 420. In the present embodiment, the first blocking member 610 may have the form of a groove that is recessed inward from a top surface of the heat dissipation member 420. The first blocking member 610 may be disposed in a longitudinal direction parallel to the outer channel 531. Both ends of the first blocking member 610 may be closed.

The first blocking member 610 may be disposed between the first heat dissipation portion 422 and the second heat dissipation portion 423. In an example, the first blocking member 610 may be a void formed between an outermost first heat dissipation portion 422 and the second heat dissipation portion 423. The first blocking member 610 may be provided in pairs. Each pair of first blocking members 610 may be respectively disposed between a pair of outermost first heat dissipation portions 422 and the second heat dissipation portion 423. Accordingly, the first blocking member 610 may provide a space for moisture flowing along the top surface of the heat dissipation member 420 to be received in the outermost region of the outer channel 531, thereby primarily blocking moisture from entering the interior of the housing 100 through the outer channel 531.

The second blocking member 620 protrudes from the outer channel 531 to block moisture from entering the interior of the housing 100. In the present embodiment, the second blocking member 620 may be formed to have the shape of a step protruding upwardly from the bottom surface of the outer channel 531. The second blocking member 620 may be disposed at the other end of the outer channel 531, i.e., the end side of the outer channel 531 that is connected to the transfer hole 532. The height of the second blocking member 620 may be less than the height of the transfer hole 532. Accordingly, the second blocking member 620 may allow air to pass through the transfer hole 532 while blocking moisture introduced into the outer channel 531 from entering the interior space of the housing 100 through the transfer hole 532.

The following describes the operation of an electronic device according to an embodiment of the present disclosure.

Figure 9:
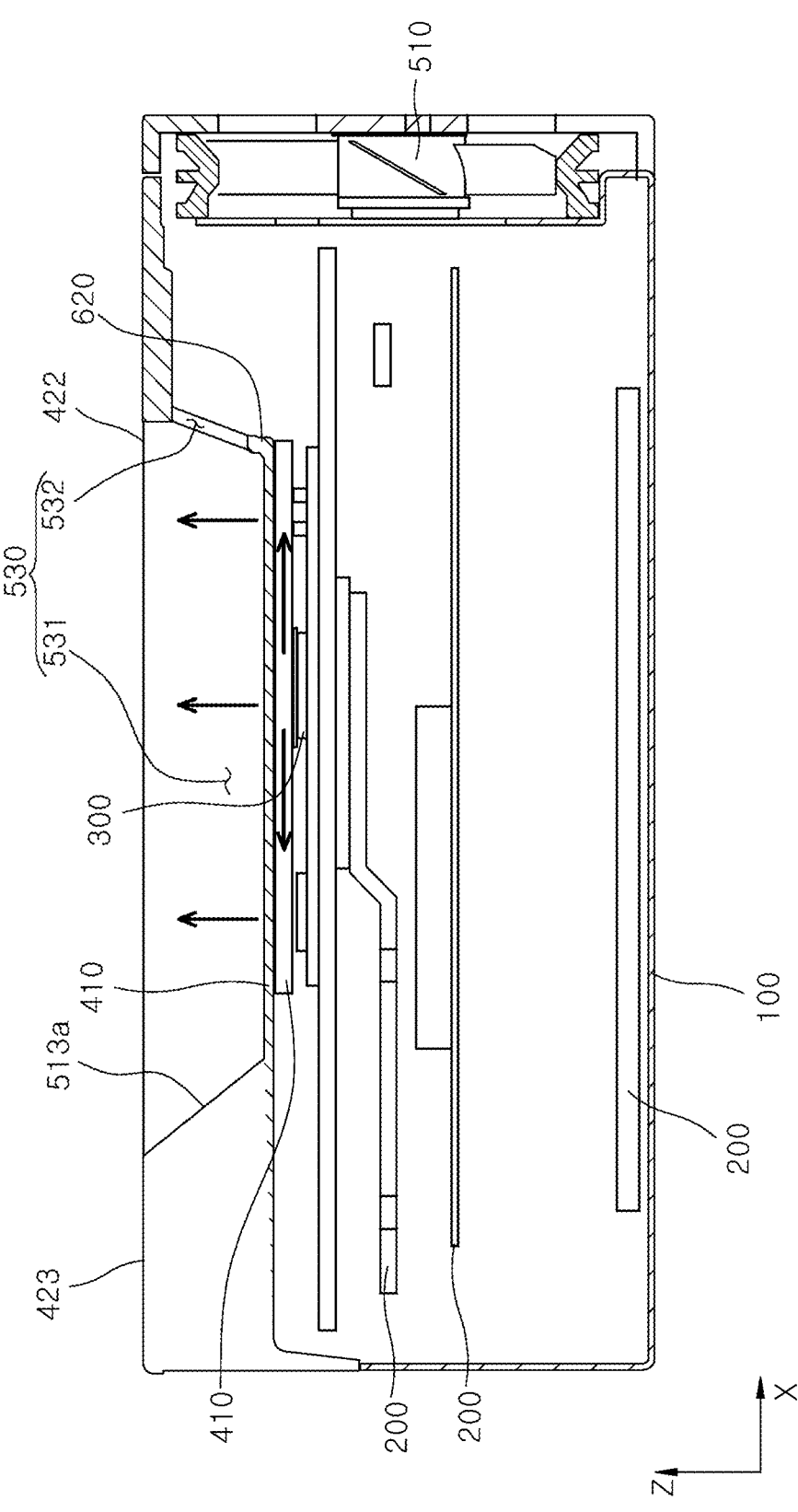
Figure 10:
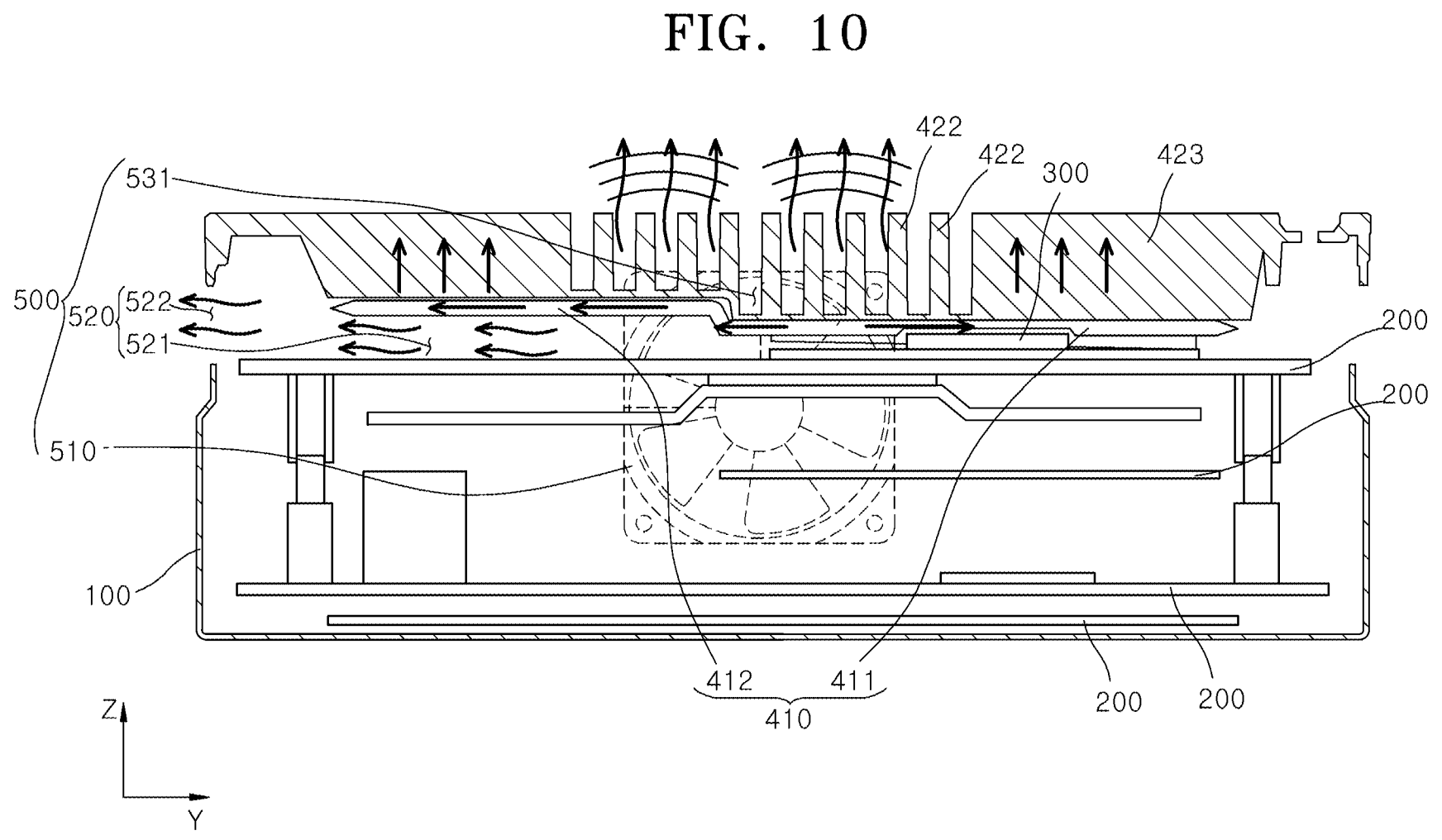

FIGS. 9 and 10 are diagrams schematically illustrating operational states of the electronic device according to embodiments of the present disclosure.

Referring to FIGS. 9 and 10, during operation of the electronic element 300, heat generated by the electronic element 300 is transferred to the first end 411 of the heat pipe 410 through conduction.

The heat pipe 410 transfers the heat transferred to the first end 411 toward the second end 412.

A portion of the heat transferred from the first end 411 to the second end 412 is transferred by conduction to the heat dissipation member 420 in contact with the heat pipe 410.

The heat entering the heat dissipation member 420 is transferred to the first heat dissipation portion 422 and the second heat dissipation portion 423 via the heat dissipation body 421.

The first heat dissipation portion 422 and the second heat dissipation portion 423 dissipate the heat generated by the electronic element 300 to the outside of the housing 100 by convection with external air of the housing 100 and by their own radiation.

As the fan 510 is operated in this state, the external air of the housing 100 is drawn into the interior of the housing 100.

A portion of the air drawn into the interior of the housing 100 by the fan 510 enters the inner channel 521 and is brought into contact with the second end 412 of the heat pipe 410.

The air entering the inner channel 521 is heat exchanged with the second end 412 through convection, and is discharged to the outside of the housing 100 through the discharge hole 522, cooling the second end 412.

The rest of the air drawn into the interior of the housing 100 by the fan 510 enters the outer channel 531 through the transfer hole 532.

The air introduced into the outer channel 531 may be brought into contact with the first heat dissipation portion 422, heat exchange with the first heat dissipation portion 422 through convection, and promote cooling of the first heat dissipation portion 422.

While the present disclosure has been described with reference to the embodiments depicted in the drawings, the embodiments are for illustrative purposes only, and those skilled in the art to which the present technology pertains will understand that various modifications of the embodiments and any other embodiments equivalent thereto are available. Therefore, the scope of technical protection of the present disclosure is to be defined by the appended claims.

What is claimed is:

1. An electronic device comprising:
a housing;
a substrate disposed in an interior of the housing;
an electronic element mounted on the substrate;
a first cooling member in contact with the electronic element and configured to absorb heat generated by the electronic element; and a second cooling member spaced apart from the electronic element and configured to circulate air into and out of the housing,
wherein the first cooling member includes:
a heat pipe including a first end in contact with the electronic element and a second end spaced apart from the first end, and configured to transfer the heat received from the electronic element from the first end toward the second end; and
a heat dissipation member in contact with the heat pipe and configured to dissipate heat received from the heat pipe to the outside of the housing,
wherein the second cooling member includes:
a fan coupled to the housing and configured to draw the air from the outside to the inside of the housing;
a first guide portion guiding, toward the heat pipe, a flow of a portion of the air drawn to the inside of the housing by the fan; and
a second guide portion guiding, toward the heat dissipation member, a flow of another portion of the air drawn to the inside of the housing by the fan,
wherein the heat dissipation member includes:
a heat dissipation body coupled to the housing and in contact with the heat pipe;
a first heat dissipation portion protruding from the heat dissipation body toward the outside of the housing; and
a second heat dissipation portion protruding from the heat dissipation body toward the outside of the housing and spaced apart from the first heat dissipation portion,
wherein the second guide portion includes an outer channel externally disposed on the housing in a position facing the first heat dissipation portion, and
wherein a first blocking member is disposed between the first heat dissipation portion and the second heat dissipation portion and configured to block moisture from entering the outer channel.

2. The electronic device of claim 1, wherein the heat pipe is disposed to face a topmost substrate vertically on an upper side of the housing.

3. The electronic device of claim 1, wherein a volume of the second heat dissipation portion is greater than a volume of the first heat dissipation portion.

4. The electronic device of claim 1, wherein the first heat dissipation portion is disposed between the first end and the second end.

5. The electronic device of claim 1, wherein the first guide portion includes:
an inner channel disposed between the substrate and the second end; and
a discharge hole penetrating through the housing or the heat dissipation body and configured to discharge the air drawn into the inner channel to the outside of the housing.

6. The electronic device of claim 5, wherein a gap between the substrate and the second end is greater than a gap between the substrate and the first end.

7. The electronic device of claim 6, further including a stepped portion formed with first and second ends disposed crosswise with respect to the first end and the second end.

8. The electronic device of claim 1, wherein the second guide portion further includes:
a transfer hole penetrating through the heat dissipation body so as to be connected to the outer channel and configured to transfer the air drawn to the inside of the housing to the outer channel.

9. The electronic device of claim 8, wherein the outer channel includes a form of a groove that is recessed downwardly from a top surface of the heat dissipation member.

10. The electronic device of claim 8, wherein the first heat dissipation portion is provided in plural so that the outer channel is disposed between adjacent ones of the plurality of first heat dissipation portions.

11. The electronic device of claim 8, wherein the first blocking member is recessed inward from a top surface of the heat dissipation member.

12. The electronic device of claim 8, wherein the first blocking member is disposed parallel to the outer channel.

13. The electronic device of claim 8, further including:
 a second blocking member protruding from the outer channel toward the transfer hole and configured to block moisture from entering the inside of the housing.

14. The electronic device of claim 13, wherein the second blocking member is disposed at an end of the outer channel.

15. The electronic device of claim 13, wherein a height of the second blocking member is less than a height of the transfer hole.

16. An electronic device comprising:
 a housing;
 a substrate disposed in an interior of the housing;
 an electronic element mounted on the substrate;
 a first cooling member in contact with the electronic element and configured to absorb heat generated by the electronic element; and
 a second cooling member spaced apart from the electronic element and configured to circulate air into and out of the housing,
 wherein the first cooling member includes:
  a heat pipe including a first end in contact with the electronic element and a second end spaced apart from the first end, and configured to transfer the heat received from the electronic element from the first end toward the second end; and
  a heat dissipation member in contact with the heat pipe and configured to dissipate heat received from the heat pipe to the outside of the housing,
 wherein the second cooling member includes:
  a fan coupled to the housing and configured to draw the air from the outside to the inside of the housing;
  a first guide portion guiding, toward the heat pipe, a flow of a portion of the air drawn to the inside of the housing by the fan; and
  a second guide portion guiding, toward the heat dissipation member, a flow of another portion of the air drawn to the inside of the housing by the fan;
 wherein the heat dissipation member includes:
  a heat dissipation body coupled to the housing and in contact with the heat pipe;
  a first heat dissipation portion protruding from the heat dissipation body toward the outside of the housing; and
  a second heat dissipation portion protruding from the heat dissipation body toward the outside of the housing and spaced apart from the first heat dissipation portion,
 wherein the second guide portion includes:
  an outer channel externally disposed on the housing in a position facing the first heat dissipation portion; and
  a transfer hole penetrating through the heat dissipation body so as to be connected to the outer channel and configured to transfer the air drawn to the inside of the housing to the outer channel,
 wherein a blocking member is protruded from the outer channel toward the transfer hole and configured to block moisture from entering the inside of the housing.

* * * * *